US010497613B2

(12) United States Patent
Chawla et al.

(10) Patent No.: US 10,497,613 B2

(45) Date of Patent: Dec. 3, 2019

(54) MICROELECTRONIC CONDUCTIVE ROUTES AND METHODS OF MAKING THE SAME

(71) Applicant: INTEL CORPORATION, Santa Clara, CA (US)

(72) Inventors: Jasmeet S. Chawla, Hillsboro, OR (US); Rami Hourani, Portland, OR (US); Mauro J. Kobrinsky, Portland, OR (US); Florian Gstrein, Portland, OR (US); Scott B. Clendenning, Portland, OR (US); Jeanette M. Roberts, North Plains, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/560,245

(22) PCT Filed: Apr. 29, 2015

(86) PCT No.: PCT/US2015/028209

§ 371 (c)(1),
(2) Date: Sep. 21, 2017

(87) PCT Pub. No.: WO2016/175782

PCT Pub. Date: Nov. 3, 2016

(65) Prior Publication Data

US 2018/0082942 A1 Mar. 22, 2018

(51) Int. Cl.

*H01L 21/768* (2006.01)
*H01L 23/532* (2006.01)
*H01L 23/522* (2006.01)

(52) U.S. Cl.

CPC .. *H01L 21/76834* (2013.01); *H01L 21/76814* (2013.01); *H01L 21/76819* (2013.01);

(Continued)

(58) Field of Classification Search

CPC ........... H01L 23/5226; H01L 23/53295; H01L 21/76814; H01L 21/76819;

(Continued)

(56) References Cited

U.S. PATENT DOCUMENTS 6,265,313 B1 7/2001 Huang et al.
6,589,887 B1 7/2003 Dalton et al.

(Continued)

FOREIGN PATENT DOCUMENTS

JP 2000332102 11/2000

OTHER PUBLICATIONS

International Search Report and Written Opinion for International Patent Application No. PCT/US2015/028209, dated Jan. 28, 2016.

(Continued)

*Primary Examiner* — Marcos D. Pizarro

(74) *Attorney, Agent, or Firm* — Green, Howard, & Mughal LLP

(57) ABSTRACT

A conductive route structure may be formed comprising a conductive trace and a conductive via, wherein the conductive via directly contacts the conductive trace. In one embodiment, the conductive route structure may be formed by forming a dielectric material layer on the conductive trace. A via opening may be formed through the dielectric material layer to expose a portion of the conductive trace and a blocking layer may be from only on the exposed portion of the conductive trace. A barrier line may be formed on sidewalls of the via opening and the blocking layer may thereafter be removed. A conductive via may then be formed within the via opening, wherein the conductive via directly contacts the conductive trace.

14 Claims, 6 Drawing Sheets

200

250 230 230 260 230 130 120 110

(52) U.S. Cl.
CPC .. *H01L 21/76831* (2013.01); *H01L 21/76877* (2013.01); *H01L 23/5226* (2013.01); *H01L 23/53295* (2013.01); *H01L 2221/101* (2013.01); *H01L 2221/1063* (2013.01)

(58) Field of Classification Search
CPC ......... H01L 21/76831; H01L 21/76834; H01L 21/76877; H01L 2221/101; H01L 2221/1063
See application file for complete search history.

(56) References Cited

U.S. PATENT DOCUMENTS 6,905,958 B2 6/2005 Gracias et al.
9,418,888 B2 8/2016 Bristol et al.
2002/0025690 A1 2/2002 Kawahara et al.
2006/0128142 A1* 6/2006 Whelan .................. B82Y 30/00 438/638
2007/0087554 A1* 4/2007 Louis ................ H01L 21/76831 438/618
2013/0334700 A1 12/2013 Singh et al.
2014/0061855 A1 3/2014 Kuo et al.

OTHER PUBLICATIONS

Maestre Caro, A. et al., “Selective self-assembled monolayer coating to enable Cu-to-Cu connection in dual damascene vias”, Microlectronic Engineering, vol. 106, Jun. 2013, pp. 76-60, Elsevier Science Ltd., Oxford, UK.

Supplementary European Search Report from European Patent Application No. 15890917.6 dated Nov. 2, 2018, 9 pgs.

Non-Final Office Action from Taiwan Patent Application No. 105108822 dated May 23, 2019, 9 pgs.

* cited by examiner

MICROELECTRONIC CONDUCTIVE ROUTES AND METHODS OF MAKING THE SAME

RELATED APPLICATION

The present application is a national stage entry of PCT Patent Application No. PCT/US2015/028209, filed on Apr. 29, 2015, entitled "MICROELECTRONIC CONDUCTIVE ROUTES AND METHODS OF MAKING THE SAME", which is hereby incorporated herein by reference in its entirety and for all purposes.

TECHNICAL FIELD

Embodiments of the present description generally relate to the field of microelectronic devices, and, more particularly, to the fabricating conductive route structures through and on dielectric layers in microelectronic devices.

BACKGROUND

The microelectronic industry is continually striving to produce ever faster and smaller microelectronic devices for use in various electronic products, including, but not limited to portable products, such as portable computers, digital cameras, electronic tablets, cellular phones, and the like. As the size of components, such as microelectronic dice and microelectronic substrates, are reduced, the size of the conductive routes (conductive traces and conductive vias) must also be reduced. However, the reduction of the size of the conductive routes may result in the conductive routes becoming incapable of carrying effective electrical signals for the operation of the microelectronic devices. Therefore, there is a need to develop conductive routes and methods of fabrication of the same which are capable of carrying effective electrical signals.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
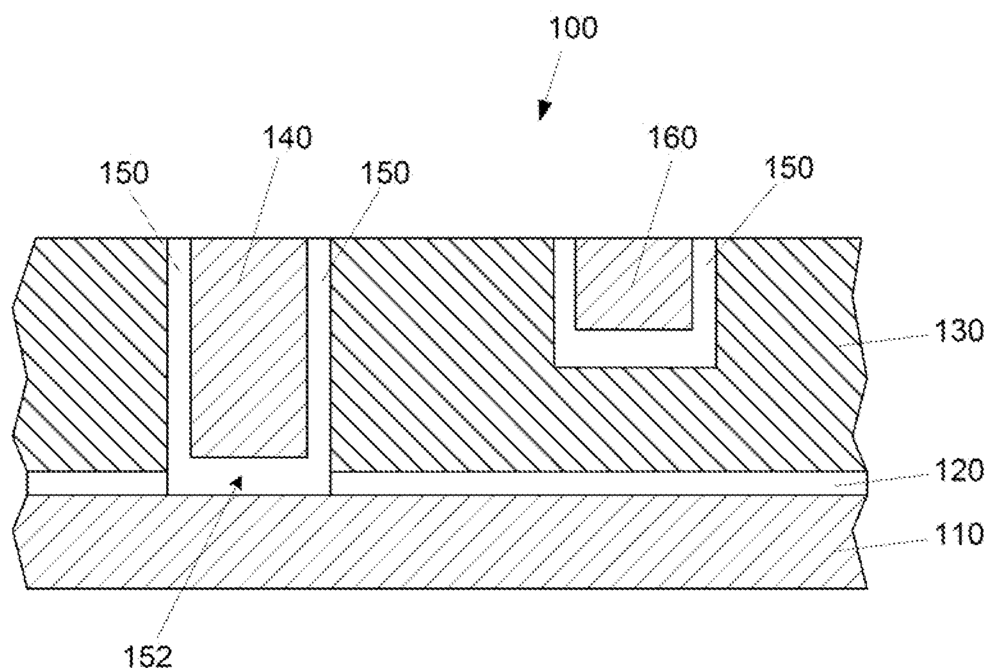
FIG. 1 illustrates side cross sectional views of a microelectronic conductive route structure, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer or component with respect to other layers or components. One layer/component "over" or "on" another layer/component or bonded "to" another layer/component may be directly in contact with the other layer/component or may have one or more intervening layers/components. One layer/component "between" layers/components may be directly in contact with the layers/components or may have one or more intervening layers/components.

Microelectronic devices are generally fabricated from various microelectronic components, including, but not limited to, at least one microelectronic die (such as a microprocessor, a chipset, a graphics device, a wireless device, a memory device, an application specific integrated circuit, or the like), at least one passive component (such as resistors, capacitors, inductors and the like), and at least one microelectronic substrate (such as interposers, motherboards, and the like) for mounting the components. Electrical signals, power delivery, and ground lines are provided through conductive route structure that may be formed in or on the microelectronic components. As will be understood to those skilled in the art, such conductive route structures may be formed as a plurality of conductive traces formed on layers of dielectric material that are connected by conductive vias.

FIG. 1 illustrates a portion of a conductive route structure 100, as known in the art. The conductive route structure 100 may comprise a first conductive trace 110 having a dielectric material layer 130 disposed thereon with a barrier material layer 120 disposed between the first conductive trace 110 and the dielectric material layer 130. The first conductive trace 110 may be made of any appropriate conductive material, including but not limited to, metals, such as copper, silver, nickel, gold, and aluminum, alloys thereof, and the like. The dielectric material layer 130 may be any appropriate dielectric material, including but not limited to, silicon dioxide ($SiO_2$), silicon oxynitride ($SiO_xN_y$), silicon nitride ($Si_3N_4$), silicon carbide (SiC), polyimide materials, and the like, as well as low-k and ultra low-k dielectrics (dielectric constants less than about 3.6), including but not limited to carbon doped dielectrics, fluorine doped dielectrics, porous dielectrics, organic polymeric dielectrics, silicon based polymeric dielectrics, and the like. As will be understood to those skilled in the art, the barrier material layer 120 may be used to enhance material adhesion and/or to prevent the material used to form the first conductive traces 110 from migrating into the adjacent dielectric material layer 130. The barrier material layer 120 may be made of any appropriate material, including but not limited to, insulative materials, such as silicon dioxide, silicon nitride, silicon oxynitride, silicon carbide, and the like.

As further shown in FIG. 1, a conductive via 140 may be formed through the dielectric material layer 130. A barrier liner 150 may be formed to prevent the materials used to form the conductive via 140 from migrating into the dielectric material layer 130. The barrier liner 150 may be formed by substantially conformal deposition. Although the deposition results in the barrier liner 150 forming between the dielectric material layer 130 and the conductive via 140, it also results in a portion 152 of the barrier liner 150 forming on the first conductive trace 110, i.e. between the conductive via 140 and the first conductive trace 110. As the materials used in the formation of the barrier liner 150 may be far less conductive than the materials used for the conductive via 140 and the first conductive trace 110, the portion 152 of the barrier liner 150 between the conductive via 140 and the first conductive trace 110 will impede the flow of electricity (i.e. creates resistance). Furthermore, if the deposition process to form the barrier liner 150 is less than conformal, a greater amount of material may form in barrier liner portion 152 than is formed adjacent the dielectric material layer 130 (as illustrated), which may further increase electrical resistance between the conductive via 140 and the first conductive trace 110.

As also shown in FIG. 1 and as will be understood to those skilled in the art, at least one second conductive trace 160 may be also be formed in the dielectric material layer during the formation of the conductive via 140, wherein the illustrated portion of the second conductive trace 160 extends in a direction perpendicular to the illustration.

Embodiments of the present description include a conductive route structure comprising a conductive trace and a conductive via, wherein the conductive via directly contacts the conductive trace. In one embodiment, the conductive route structure may be formed by forming a dielectric material layer on the conductive trace. A via opening may be formed through the dielectric material layer to expose a portion of the conductive trace and a blocking layer may be formed only on the exposed portion of the conductive trace. A barrier line may be formed on sidewalls of the via opening and the blocking layer may thereafter be removed. A conductive via may then be formed in the via opening, wherein the conductive via directly contacts the conductive trace.

Figure 2:
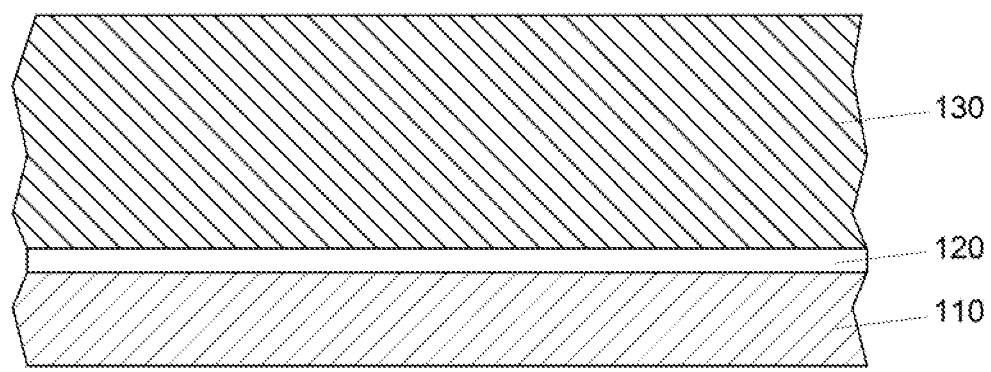
FIGS. 2-8 illustrate side cross sectional views of a method of forming a microelectronic conductive route structure, according to an embodiment of the present description.

FIGS. 2-6 illustrate a method of fabricating a microelectronic route structure according to one embodiment of the present description. As shown in FIG. 2, the first conductive trace 110 may be formed having the dielectric material layer 130 disposed thereon with the barrier material layer 120 disposed between the first conductive trace 110 and the dielectric material layer 130, as described with regard to FIG. 1. The various methods for fabrication or deposition of the first conductive trace 110, the barrier material layer 120, and the dielectric material layer 130 are well known in the art, and for the sake of brevity and conciseness will not be described or illustrated herein.

Figure 3:
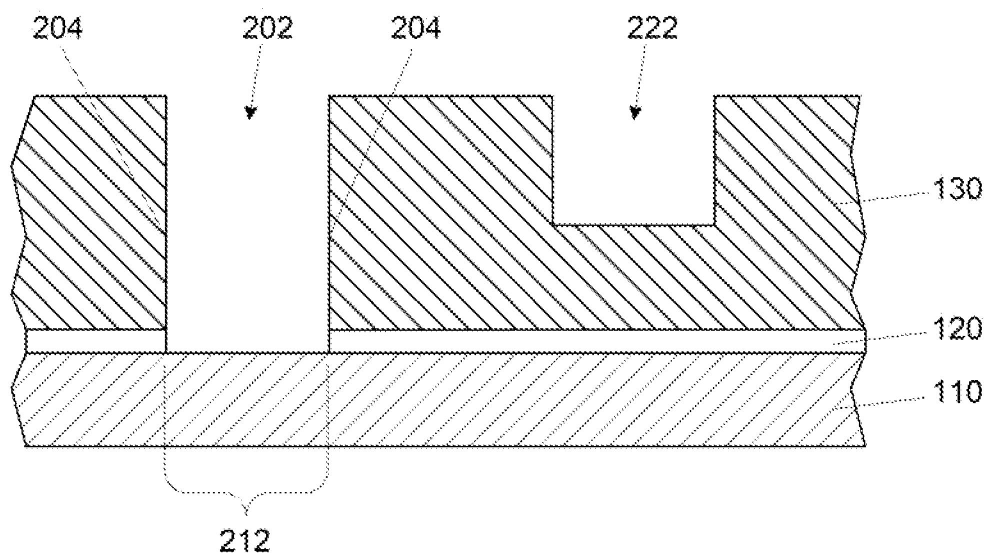

As shown in FIG. 3, at least one via opening 202 may be formed through the dielectric material layer 130 and the barrier material layer 120 to expose a portion 212 of the first conductive trace 110. Additionally, as shown in FIG. 3, at least one trace trench 222 may also be formed in the dielectric material layer 130. As will be understood to those skilled in the art, the illustrated portion of the trace trench 222 would extend in the dielectric material layer 130 in a direction perpendicular to the illustration. As will also be understood to those skilled in the art, the via opening 202 may be a part of and extend from a trace trench. The via openings 202 and the trace trenches 222 may be formed by any known technique, such as photolithography, etching, and laser ablation.

Figure 4:
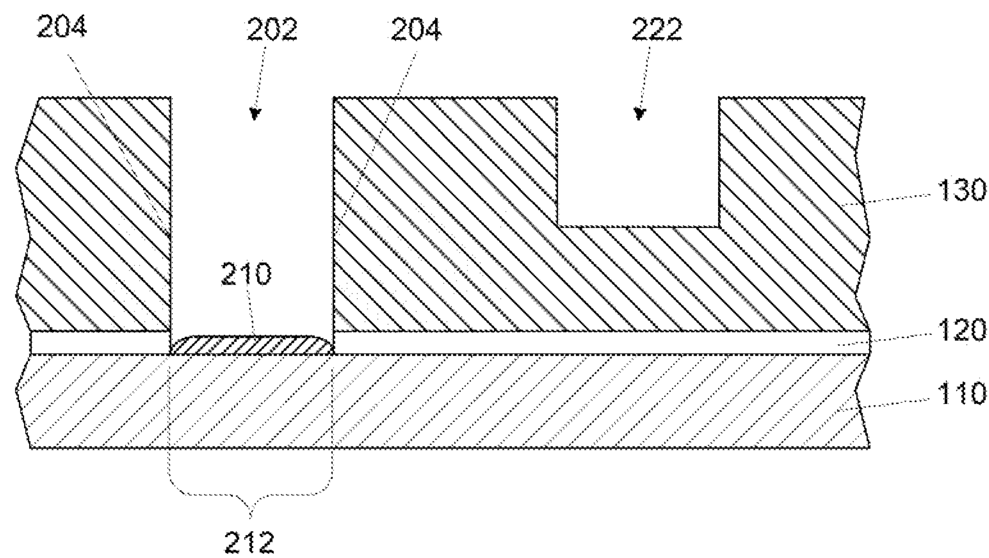

As shown in FIG. 4, a blocking layer 210 may be formed on the exposed portion 212 of the first conductive trace 110. The blocking layer 210 may be used to prevent the deposition of a subsequently deposited barrier layer on the first conductive trace 110, as will be discussed, and may be selective to depositing on the first conductive trace 110 without depositing on the dielectric material layer 130. In one embodiment, the blocking layer 210 may be a self-assembled monolayer. In one embodiment, the self-assembled monolayer blocking layer 210 may be an organic material. In another embodiment, the organic material for the blocking layer may be molecules having alkyl chains, wherein the alkyl chains may comprise between one (1) and twenty-two (22) carbon atoms. In an embodiment, the alkyl chain may contain a head group, including, but not limited to alkenes, alkyne, amines, phosphines, thiols, phosphonic acids, carboxylic acids, and the like. In a specific embodiment, the blocking layer 210 may comprise octadecylphosphonic acid or octadecylthiol. In another embodiment, the blocking layer 210 may comprise alkoxysilanes, aminosilanes, and chlorosilanes; however, such materials may react with both the first conductive trace 110 and the dielectric material layer 130 and, thus, an extra step may be required to selectively remove the blocking layer 210 from the dielectric material layer 130, such as by thermal annealing, dry etch, wet etch, or the like.

Figure 5:
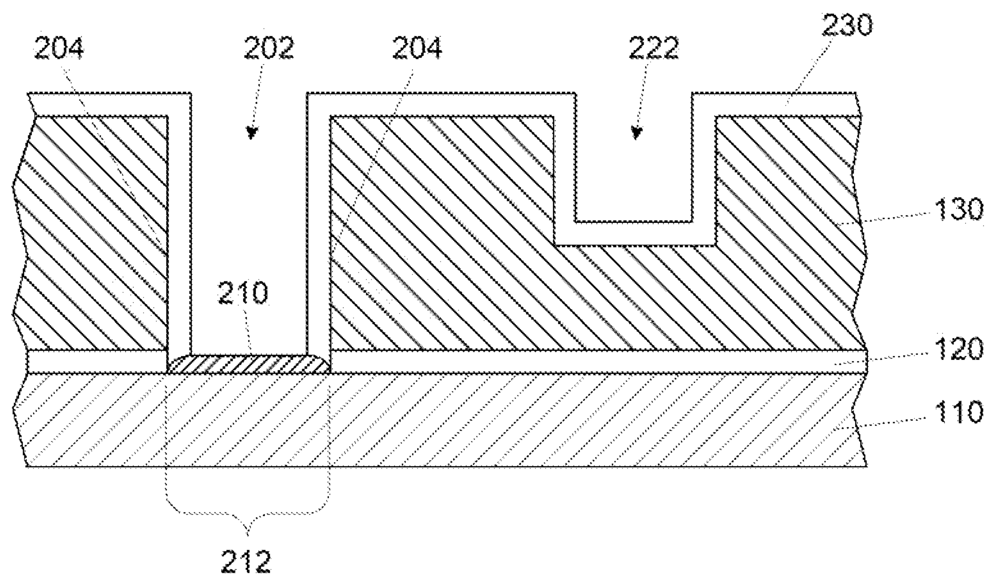

As shown in FIG. 5, a barrier liner 230 may be formed on sidewalls 204 of the via opening 202, as well as on the dielectric material layer 130 and in the trace trench 222. In an embodiment of the present description, the barrier liner 230 may be formed with an atomic layer deposition process. In one embodiment, the barrier liner 230 may be a high-K material, such as a metal oxide, including but not limited to hafnium oxide ($HfO_2$) and zirconium oxide ($ZrO_2$). In a specific embodiment, tetrakis(dimethylamido)hafnium may be reacted with water at 250° C. in an atomic layer deposition process to produce hafnium oxide film for the barrier liner 230. The various methods and operating parameter for an atomic layer deposition process are well known in the art, and for the sake of brevity and conciseness will not be described or illustrated herein. In one embodiment, the barrier liner 230 may be conformally deposited and may be deposited to a thickness between about 1 nm and 2 nm.

Figure 6:
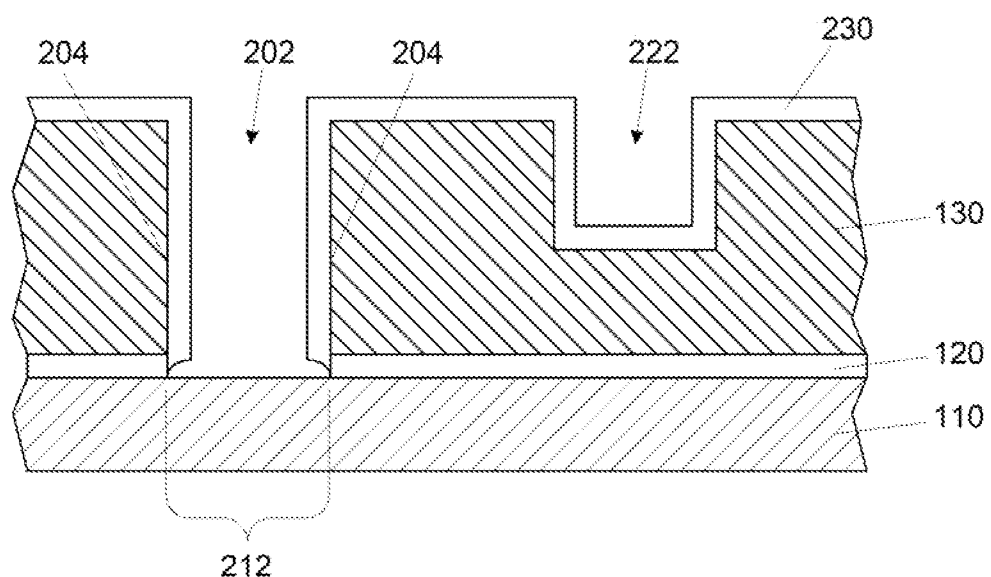

As shown in FIG. 6, the blocking layer 210 (see FIGS. 4 and 5) may be removed to again expose the portion 212 of the first conductive trace 110. In one embodiment, the blocking layer 210 may be removed by a thermal treatment, such as heating to a temperature greater than about 450° C. for 30 minutes. In another embodiment, the blocking layer 210 may be removed with a dry etch or a wet etch. In one embodiment, the wet etch may be performed with a mild acidic or basic solution, such as emersion in a 50:1 hydrofluoric acid/water solution for one minute.

Figure 7:
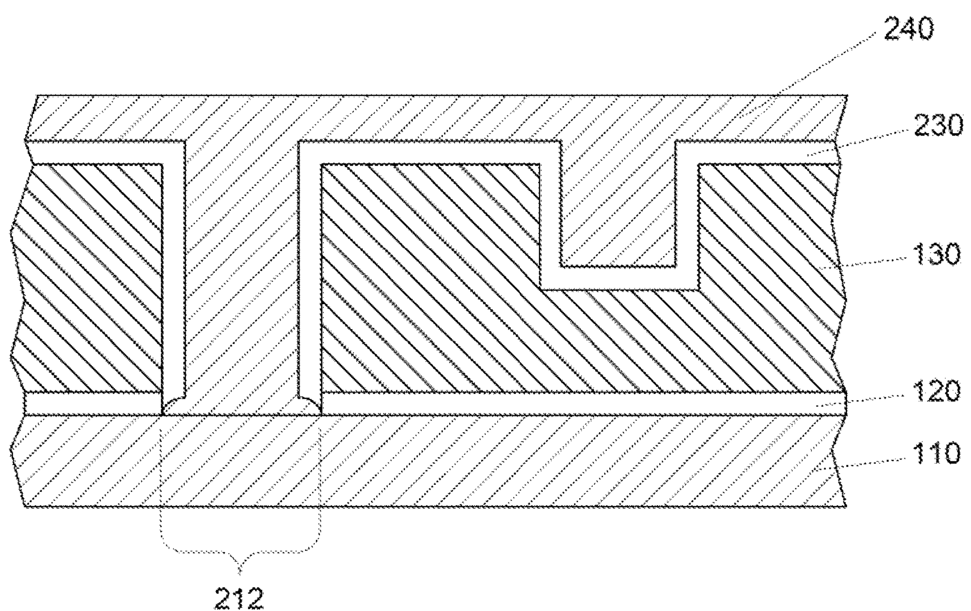

As shown in FIG. 7, a conductive fill material 240 may be deposited in the via opening 202 (see FIG. 6), such that it directly contacts the first conductive trace 110. The conductive fill material 240 may be simultaneously deposited in the trace trench 222 (see FIG. 6). The conductive fill material 240 may be made of any appropriate conductive material, including but not limited to, metals, such as copper, silver, nickel, gold, and aluminum, alloys thereof, and the like.

Figure 8:
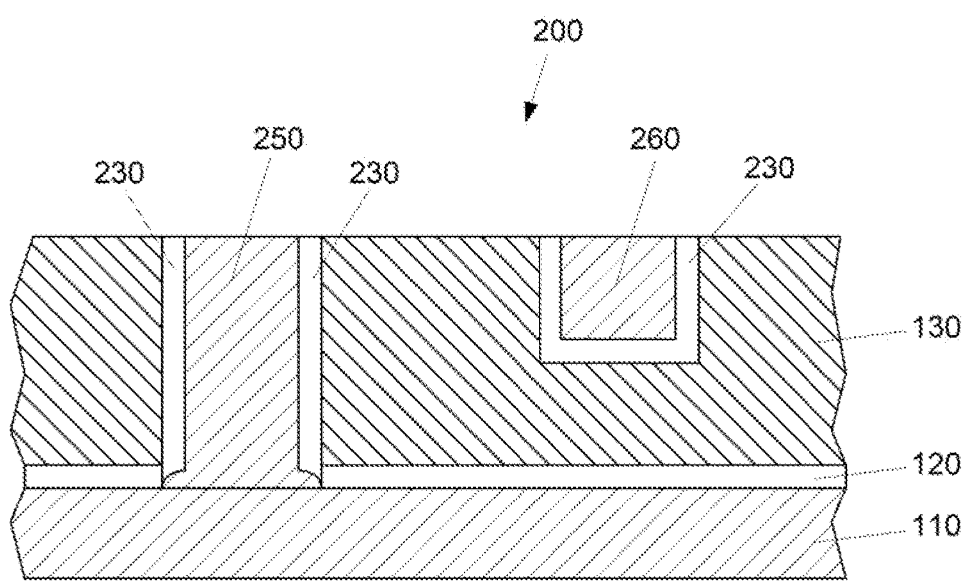

As shown in FIG. 8, the conductive fill material 240 extending over the dielectric material layer 130 (see FIG. 7) may be removed, such as by chemical mechanical polishing, to form at least one conductive via 250 and at least one second conductive trace 260, which are electrically isolated from one another, and thereby forming a conductive route structure 200.

As shown in FIGS. 2-8, the embodiments of the present description may result in the conductive route structure 200 having direct contact between the conductive via 250 and the conductive trace 110, which may improve electrical performance over structures having barrier liner material therebetween.

It is further noted that barrier liners 230 formed from a high-K dielectric metal oxide may reduce electron scattering effects in the conductive vias 250 and the second conductive traces 260, which may reduce resistance compared to known structures. Furthermore, the insulating nature of the high-K dielectric metal oxide may result in a larger effective line spacing, and, therefore, may result in lower capacitance based on the K value of the metal oxide.

Figure 9:
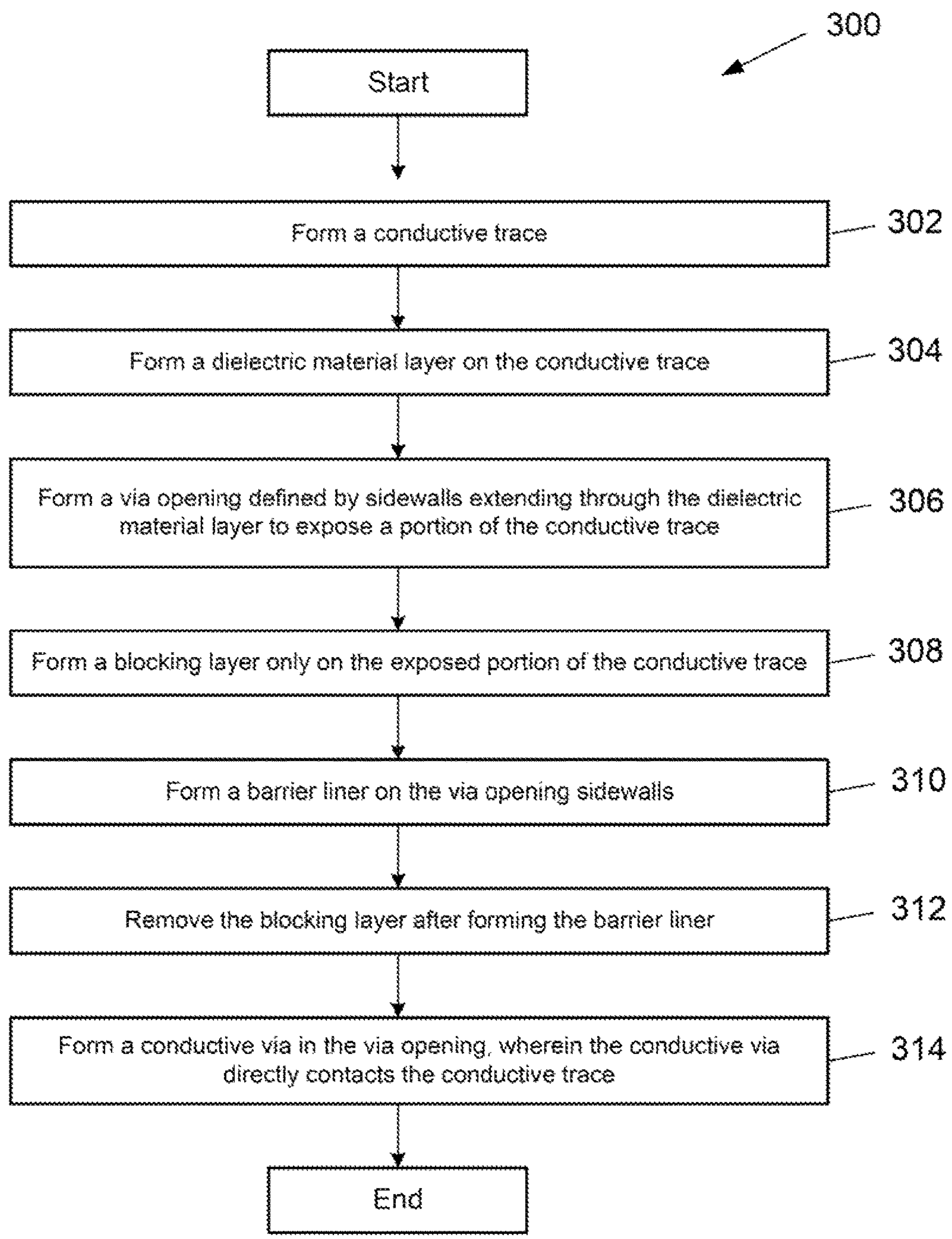
FIG. 9 is a flow diagram of a process of fabricating a microelectronic test device, according to an embodiment of the present description.

FIG. 9 is a flow chart of a process 300 of fabricating a microelectronic conductive route according to an embodiment of the present description. As set forth in block 302, a conductive trace may be formed. A dielectric material layer may be formed on the conductive trace, as set forth in block 304. As set forth in block 306, a via opening defined by sidewalls may be formed to extend through the dielectric material layer exposing a portion of the conductive trace. A blocking layer may be formed only on the exposed portion of the conductive trace, as set forth in block 308. As set forth in block 310, a barrier liner may be formed on the via opening sidewalls. The blocking layer may be removed after forming the barrier liner, as set forth in block 312. As set forth in block 314, a conductive via may be formed in the via opening, wherein the conductive via directly contacts the conductive trace.

Figure 10:
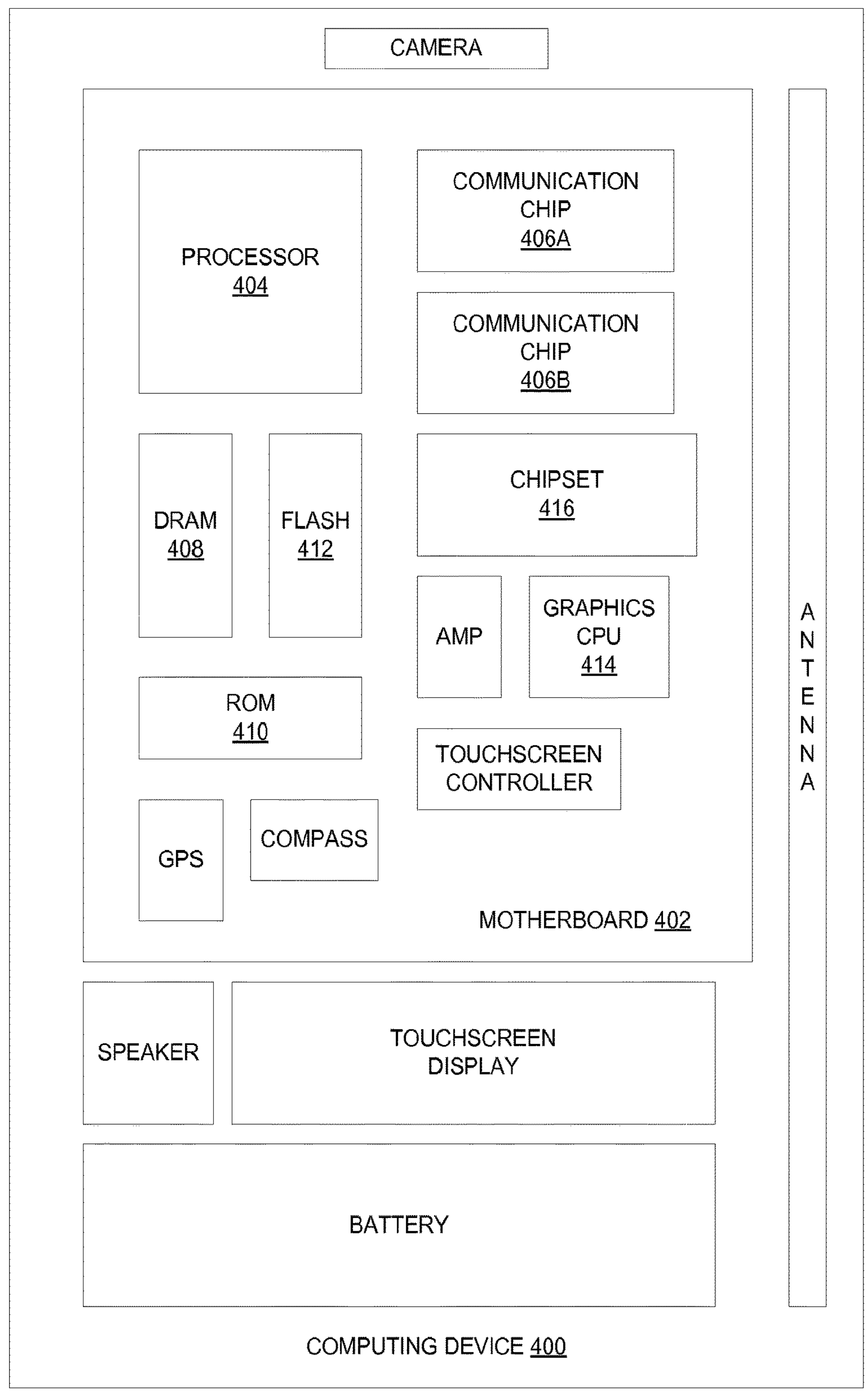
FIG. 10 illustrates a computing device in accordance with one implementation of the present description.

FIG. 10 illustrates a computing device 400 in accordance with one implementation of the present description. The computing device 400 houses a board 402. The board may include a number of microelectronic components, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 402. In some implementations, at least one of the microelectronic components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include a conductive route structure, comprising a conductive trace, a dielectric material layer formed on the conductive trace, and a conductive via extending through the dielectric material layer, wherein the conductive via directly contacts the conductive trace, as described herein.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-10. The subject matter may be applied to other microelectronic device and assembly applications, as will be understood to those skilled in the art.

The following examples pertain to further embodiments, wherein Example 1 is a method of forming a conductive route structure, comprising forming a conductive trace, forming a dielectric material layer on the conductive trace; forming a via opening defined by sidewalls extending through the dielectric material layer to expose a portion of the conductive trace; forming a blocking layer only on the exposed portion of the conductive trace; forming a barrier liner on the via opening sidewalls; removing the blocking layer after forming the barrier liner; and forming a conductive via in the via opening, wherein the conductive via directly contacts the conductive trace.

In Example 2, the subject matter of Example 1 can optionally include forming a barrier material layer between the conductive trace and the dielectric material layer, wherein the via opening extends through the dielectric material layer and the barrier material layer.

In Example 3, the subject matter of any of Examples 1 to 2 can optionally include forming the blocking layer comprising forming a self-assembled monolayer.

In Example 4, the subject matter of any of Examples 1 to 2 can optionally include forming the blocking layer from an organic material.

In Example 5, the subject matter of Example 4 can optionally include forming the blocking layer from organic molecules having alkyl chains.

In Example 6, the subject matter of Example 5 can optionally include forming the blocking layer from organic molecules having alkyl chains with between 1 and 22 carbon atoms.

In Example 7, the subject matter of any of Examples 5 to 6 can optionally include forming the blocking layer from organic molecules having alkyl chains comprises forming the blocking layer from organic molecules having alkyl chains including a head group selected from the group consisting of alkenes, alkyne, amines, phosphines, thiols, phosphonic acids, and carboxylic acids.

In Example 8, the subject matter of any of Examples 1 to 2 can optionally include forming the blocking layer from octadecylphosphic acid.

In Example 9, the subject matter of any of Examples 1 to 2 can optionally include forming the blocking layer from octadecylthiol.

In Example 10, the subject matter of Example 1 can optionally include forming the barrier liner from a high-K material.

In Example 11, the subject matter of any of Examples 1 to 2 can optionally include forming the barrier liner from a metal oxide.

In Example 12, the subject matter of Example 11 can optionally include forming the barrier liner from a metal oxide comprising forming a hafnium oxide barrier liner.

In Example 13, the subject matter of Example 11 can optionally include forming the barrier liner from a metal oxide comprising forming a zirconium oxide barrier liner.

The following examples pertain to further embodiments, wherein Example 14 is a conductive route structure, comprising a conductive trace; a dielectric material layer formed on the conductive trace; and a conductive via extending through the dielectric material layer, wherein the conductive via directly contacts the conductive trace.

In Example 15, the subject matter of Example 14 can optionally include a barrier material layer between the conductive trace and the dielectric material layer.

In Example 16, the subject matter of any of Examples 14 to 15 can optionally include a barrier liner disposed between the conductive via and the dielectric material layer.

In Example 17, the subject matter of Example 16 can optionally include the barrier liner comprising a high-K material.

In Example 18, the subject matter of Example 16 can optionally include the barrier liner comprising a metal oxide.

In Example 19, the subject matter of Example 18 can optionally include the metal oxide barrier liner comprising a hafnium oxide barrier liner.

In Example 20, the subject matter of Example 18 can optionally include the metal oxide barrier liner comprises a zirconium oxide barrier liner.

The following examples pertain to further embodiments, wherein Example 21 is an electronic system, comprising a board; and a microelectronic component attached to the board, wherein at least one of the microelectronic component and the board, includes a conductive route structure comprising a conductive trace, a dielectric material layer formed on the conductive trace, and a conductive via extending through the dielectric material layer, wherein the conductive via directly contacts the conductive trace.

In Example 22, the subject matter of Example 21 can optionally include a barrier material layer between the conductive trace and the dielectric material layer.

In Example 23, the subject matter of any of Examples 21 and 22 can optionally include a barrier liner disposed between the conductive via and the dielectric material layer.

In Example 24, the subject matter of Example 23 can optionally include the barrier liner comprising a high-K material.

In Example 25, the subject matter of Example 23 can optionally include the barrier liner comprising a metal oxide.

In Example 26, the subject matter of Example 25 can optionally include the metal oxide barrier liner comprising a hafnium oxide barrier liner.

In Example 27, the subject matter of Example 25 can optionally include the metal oxide barrier liner comprises a zirconium oxide barrier liner.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A method of forming a conductive route structure, comprising:

forming a conductive trace;

forming a dielectric material layer on the conductive trace;

forming a via opening defined by sidewalls extending through the dielectric material layer to expose a portion of the conductive trace;

forming a blocking layer from octadecylphosphic acid only on the exposed portion of the conductive trace;

forming a barrier liner on the via opening sidewalls, wherein the barrier liner contacts the blocking layer without contacting the conductive trace;

removing the blocking layer after forming the barrier liner; and forming a conductive via in the via opening, wherein the conductive via directly contacts the conductive trace.

2. The method of claim 1, further including forming a barrier material layer between the conductive trace and the dielectric material layer, wherein the via opening extends through the dielectric material layer and the barrier material layer.

3. The method of claim 1, wherein forming the blocking layer comprises forming a self-assembled monolayer.

4. The method of claim 1, wherein forming the barrier liner comprises forming the barrier liner from a high-K material.

5. The method of claim 1, wherein forming the barrier liner comprises forming the barrier liner from a metal oxide.

6. The method of claim 5, wherein forming the barrier liner from a metal oxide comprises forming a hafnium oxide barrier liner.

7. The method of claim 5, wherein forming the barrier liner from a metal oxide comprises forming a zirconium oxide barrier liner.

8. A method of forming a conductive route structure, comprising:

forming a conductive trace;

forming a dielectric material layer on the conductive trace;

forming a via opening defined by sidewalls extending through the dielectric material layer to expose a portion of the conductive trace;

forming a blocking layer from octadecylphosphic acid only on the exposed portion of the conductive trace;

forming a barrier liner on the via opening sidewalls;

removing the blocking layer after forming the barrier liner; and forming a conductive via in the via opening, wherein the conductive via directly contacts the conductive trace.

9. The method of claim 8, wherein forming the barrier liner comprises forming the barrier liner from a high-K material.

10. The method of claim 8, further including forming a barrier material layer between the conductive trace and the dielectric material layer, wherein the via opening extends through the dielectric material layer and the barrier material layer.

11. The method of claim 8, wherein forming the blocking layer comprises forming a self-assembled monolayer.

12. The method of claim 8, wherein forming the barrier liner comprises forming the barrier liner from a metal oxide.

13. The method of claim 12, wherein forming the barrier liner from a metal oxide comprises forming a hafnium oxide barrier liner.

14. The method of claim 12, wherein forming the barrier liner from a metal oxide comprises forming a zirconium oxide barrier liner.

* * * * *